United States Patent [19]
Hsu

[11] Patent Number: 5,966,320
[45] Date of Patent: Oct. 12, 1999

[54] SRAM STRUCTURE HAVING COMMON BIT LINE

[75] Inventor: Jowsoon Hsu, Tainan Hsien, Taiwan

[73] Assignee: Winbond Electronics Corp., Hsinchou, Taiwan

[21] Appl. No.: 09/186,528

[22] Filed: Nov. 5, 1998

[30] Foreign Application Priority Data

Mar. 13, 1998 [TW] Taiwan .................................. 87103701

[51] Int. Cl.⁶ ......................................................... G11C 11/40
[52] U.S. Cl. .......................... 365/154; 365/156; 365/190
[58] Field of Search .................................... 365/154, 156, 365/174, 190

[56] References Cited

U.S. PATENT DOCUMENTS

| | | | |
|---|---|---|---|
| 5,424,995 | 6/1995 | Miyazaki et al. ........................ | 365/154 |
| 5,453,950 | 9/1995 | Voss et al. ................................ | 365/156 |
| 5,471,420 | 11/1995 | Nii et al. .................................. | 365/154 |
| 5,663,905 | 9/1997 | Matsuo et al. ........................... | 365/154 |
| 5,689,471 | 11/1997 | Voss et al. ................................ | 365/156 |

*Primary Examiner*—Son T. Dinh
*Attorney, Agent, or Firm*—Jiawei Huang; J.C.Patents

[57] ABSTRACT

A static random access memory having a structure that allow two memory cells to use a common complementary bit line. With two memory cells using a common complementary bit line, the number of necessary bit lines will be reduce by one quarter. In other words, one quarter fewer metal lines are required. This has the effect of lowering the packing density of metal lines, or increasing the product yield and the number of memory cells that can be packed within the same wafer area.

9 Claims, 3 Drawing Sheets

SRAM STRUCTURE HAVING COMMON BIT LINE

CROSS-REFERENCE TO RELATED APPLICATION

This application claims the priority benefit of Taiwan application Ser. No. 87103701, filed Mar. 13, 1998, the full disclosure of which is incorporated herein by reference.

BACKGROUND OF THE INVENTION

1. Field of Invention

The present invention relates to a static random access memory (SRAM) structure. More particularly, the present invention relates to an SRAM having a common bit line structure.

2. Description of Related Art

As the functions of a microprocessor become more powerful, the size of software programs capable of being executed by a computer increases. In line with this trend, the need for high capacity memories increases. Therefore, how to produce high-density memories at a moderate cost is still a major issue in the semiconductor industry.

According to the difference in read/write function, a memory can be classified into two types, namely, read only memory (ROM) and random access memory (RAM). ROM is a kind of memory that allows reading from the memory only while RAM can perform both read and write functions. According to the method of data storage, ROM can be further divided into a mask ROM, a programmable ROM (PROM), an erasable programmable ROM (EPROM) and electrically erasable programmable ROM (EEPROM). According to the method of data processing within the memory, random access memory can be further classified into a static RAM (SRAM) and dynamic RAM (DRAM).

In digital data storage, a bit is generally regarded as a basic unit, and a memory cell is the device for storing a bit within the memory. FIG. 1 is an equivalent circuit diagram showing two memory cells and its associated circuit structure of a conventional SRAM. Since the structure of memory cell 10 and its associated circuits are very similar to that of memory cell 20, memory cell 10 and its associated circuits can be used as an example to explain the workings of an SRAM.

The memory cell 10 comprises four N-channel metal-oxide-semiconductor (NMOS) transistors and two resistors, wherein transistors T11 and transistor T12 are pull-down transistors, transistor T13 and transistor T14 are pass transistors, and resistors R11 and R12 are load resistors. The drain of the pass transistor T13 is connected to one end of the pull down transistor T11, and the drain of the pass transistor T14 is connected to one end of the pull down transistor T12. The gate of the pass transistor T13 and the gate of the pass transistor T14 are connected to a word line (WL) which can be used to access data within the memory cell 10. In general, each memory cell is connected to two bit lines.

For example, the source of the pass transistor T13 is coupled to a bit line BL1 while the source of the pass transistor T14 is coupled to a complementary bit line BLB1.

An Y-pass transistor T31 of the bit line BL1 and an Y-pass transistor T34 of the complementary bit line BLB1 are controlled by an Y-select signal YS1. Similarly, a Y-pass transistor T32 of the bit line BL1 and a Y-pass transistor T33 of the complementary bit line BLB1 are controlled by another Y-select signal YSB 1.

From the above description and equivalent circuit diagram shown in FIG. 1, it is obvious that each SRAM comprises a bit line and a complementary bit line. As the level of integration for SRAM increases, not only is the method of arrangement and the size of each memory cell becomes important, the number of metal lines running into the array of cells is critical too. Hence, if metal lines running into the memory cell array can be reduced, product yield and memory capacity of the memory can be improved as well.

In light of the foregoing, there is a drive for reducing the number of metal lines demanded by a memory cell array.

SUMMARY OF THE INVENTION

Accordingly, the present invention is to provide an SRAM structure capable of using a common bit line so that the number of bit lines can be reduced. Hence, the packing density of metal lines can be lowered, and the yield rate and the number of cells capable of being fabricated on a wafer can both be increased.

To achieve these and other advantages and in accordance with the purpose of the invention, as embodied and broadly described herein, the invention provides an SRAM structure capable of using a common bit line. The SRAM structure comprises a first memory cell and a second memory cell for data storage. Furthermore, the memory structure also includes a first bit line, a second bit line and a common complementary bit line for accessing data residing in the first memory cell and the second memory cell. Each of the first memory cell and the second memory cell has two terminals coupled to various bit lines. For example, the terminals of the first memory cell are coupled to the first bit line and the common complementary bit line, and the terminals of the second memory cell are coupled to the second bit line and the common complementary bit line.

The first bit line is controlled by a first Y-select signal and the second bit line is controlled by a second Y-select signal. The common complementary bit line is controlled jointly by the first Y-select signal and the second Y-select signal.

By adjusting the electrical parameters associated with the devices, the common complementary bit line can be used for accessing data in two memory cells without affecting each other. When two memory cells use just one common complementary bit line as in this invention, as much as one-fourth of the bit lines in a conventional SRAM can be eliminated. Therefore, the problem of cramming too many metal lines together in a conventional design is relieved. Thus, product yield and the number of memory cells that can be packed within a given wafer area can be increased In an actual circuit, various control signals can be supplied by the following devices, including a first Y pass transistor, a second Y pass transistor, a third Y pass transistor and an OR gate. The first bit line is controlled by passing a first Y-select signal through the first Y pass transistor, the second bit line is controlled by passing a second Y-select signal through the second Y pass transistor, and the common complementary bit line is jointly controlled by passing the first Y-select signal and the second Y-select signal through the OR gate and the third Y pass transistor.

In general, the first memory cell and the second memory cell are each constructed from four NMOS transistor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
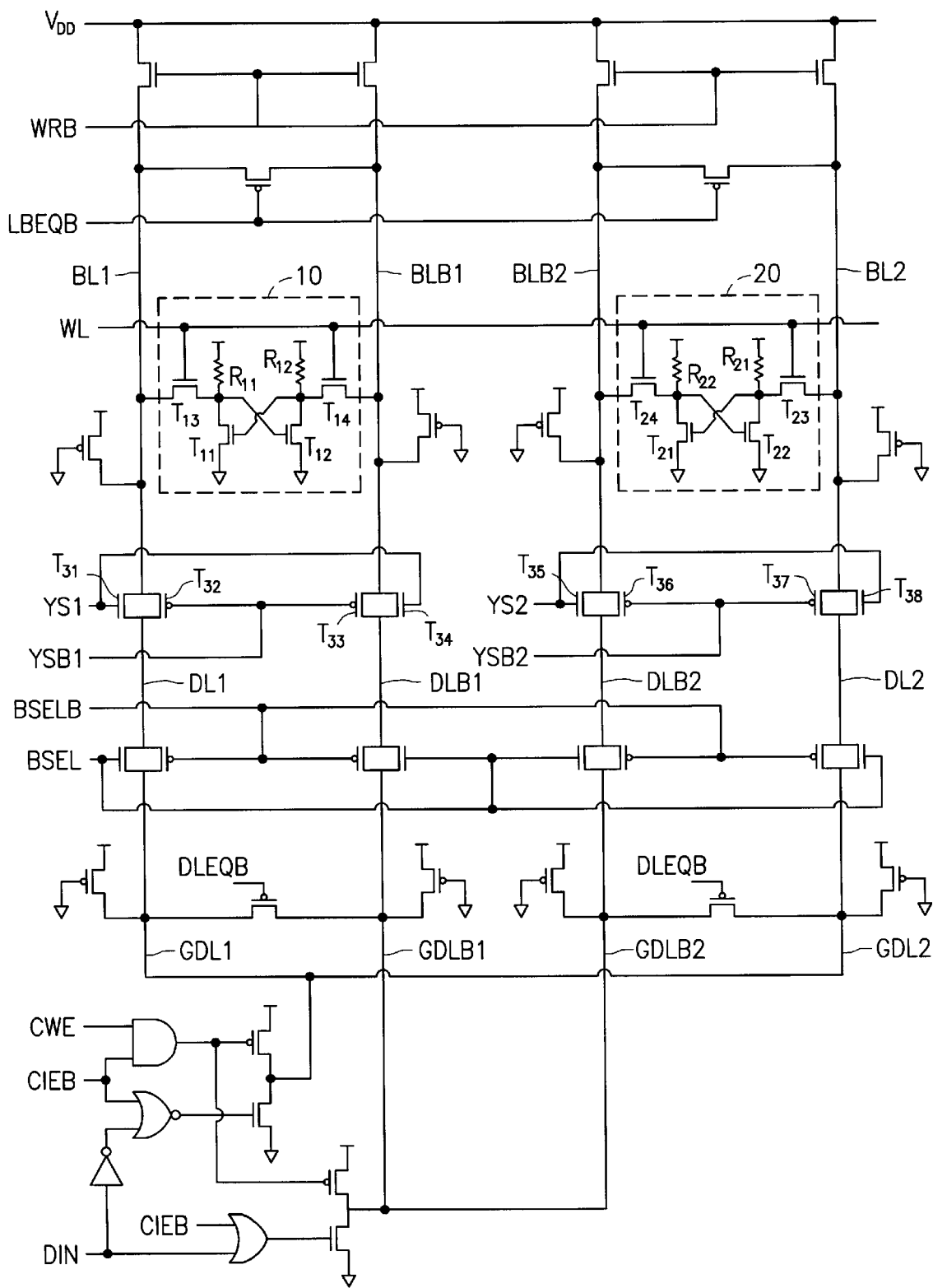
FIG. 1 is an equivalent circuit diagram showing two memory cells and its associated circuit structure of a conventional SRAM.

Reference will now be made in detail to the present preferred embodiments of the invention, examples of which are illustrated in the accompanying drawings. Wherever possible, the same reference numbers are used in the drawings and the description to refer to the same or like parts.

Figure 2:
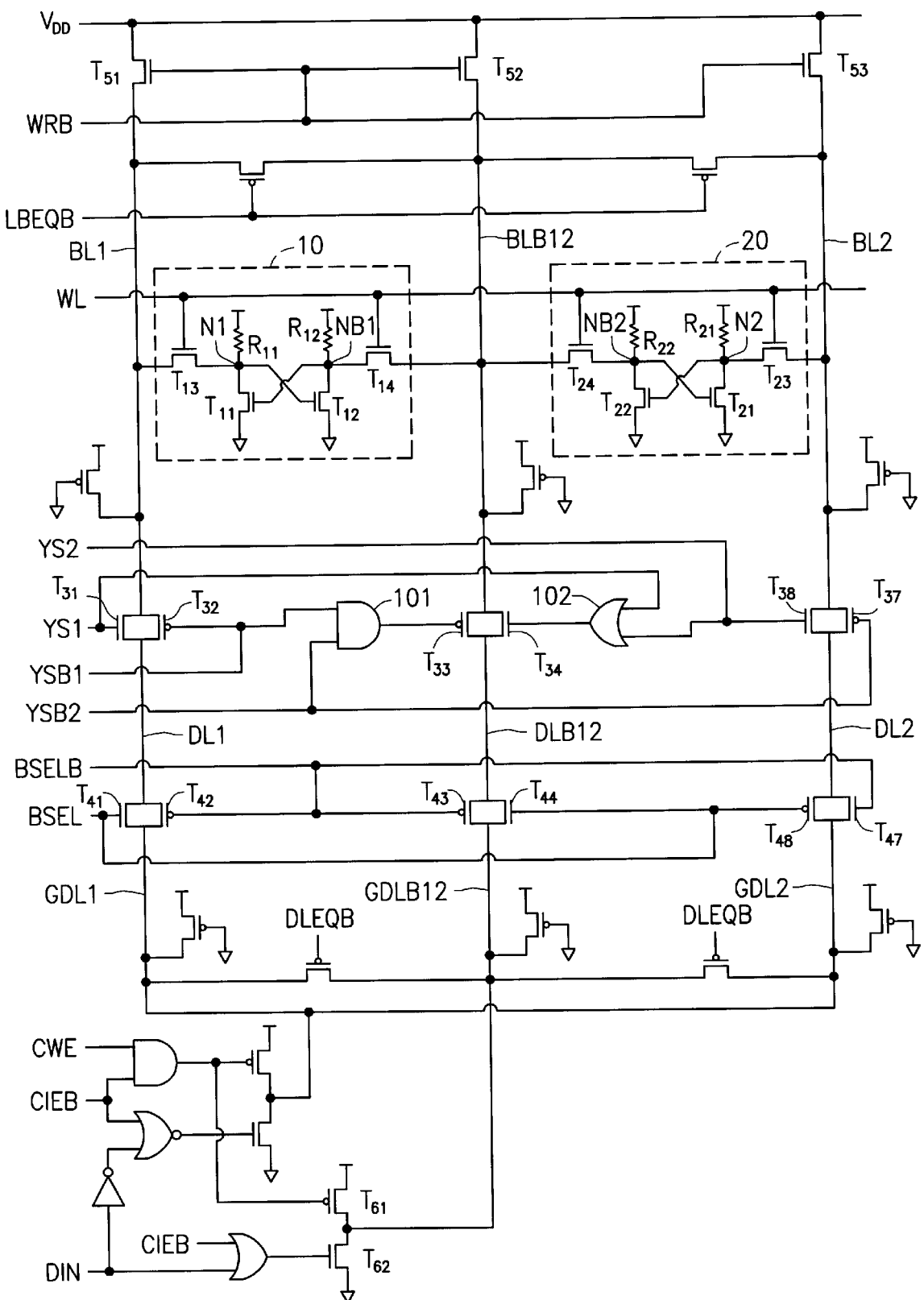
FIG. 2 is an equivalent circuit diagram showing two memory cells and its associated circuit structure using a common complementary bit line according to the preferred embodiment of this invention.

FIG. 2 is an equivalent circuit diagram showing two memory cells and its associated circuit structure using a common complementary bit line according to the preferred embodiment of this invention. As shown in FIG. 2, the source terminal of a pass transistor T13 in memory cell 10 is coupled to a bit line BL1. The source terminal of another pass transistor T23 in memory cell 20 is coupled to another bit line BL2. The source terminal of a pass transistor T14 in memory cell 10 and the source terminal of a pass transistor T24 in memory cell 20 are coupled to a common complementary bit line BLB12. Since BLB12 is used by both memory cell 10 and memory cell 20, BLB12 is controlled by Y-select signals from the two memory cells. Therefore, the AND and OR gates in FIG. 2 is used for controlling Y pass transistors T33 and T34 of the common complementary bit line BLB12.

Because the same common complementary bit line is used by both memory cells and that the pass transistors of the both memory cells are controlled by the same word line WL, the potential of a second memory cell may be affected by a first memory cell when data from the first memory cell is accessed. In this respect, data transfer can be divided into four scenarios.

In the first scenario, a data bit "1" is stored in memory cell 10 while a data bit "0" is stored in memory cell 20, and that a data bit "0" needs to be written into memory cell 10. Since the original data bit in memory cell 10 is a "1", node point N1 is at a high potential while node point NB1 is at a low potential. The original data bit in memory cell 20 is a "0", and so node point N2 is at a low potential while node point NB2 is at a high potential.

Since we want to change the stored data in memory cell 10, Y-select signals YS1 and YSB1 are used to control Y pass transistors T31, T32, T33 and T34 allowing them to be conductive. In addition, B-select signals BSEL and BSELB are used to control B pass transistors T41, T42, T43, T44, T47 and T48 allowing them to be conductive. However, because the Y pass transistors T37 and T38 are still in the non-conductive state, the conductive B pass transistors T47 and T48 will not affect the data write operation. Since pass transistors connected to bit lines BL1 and BLB12 are conductive, input data is capable of transferring from input terminal DIN to the bit lines BL1 and BLB12.

Because a data bit "0" is to be written into the memory cell 10, a low potential or logic "0" is applied to the DIN input terminal. Through associated logic circuits, the low potential is transmitted to the bit line BL1 while the complementary bit line BLB12 remains at a high potential. In the meantime, the supply of control signal to the word line WL makes the pass transistors T13 and T14 of memory cell 10 conductive. Therefore, a new data bit is written into memory cell 10.

However, due to the triggering of word line WL, pass transistors T23 and T24 of memory cell 20 will also be conductive. Hence, any change in potential on the complementary bit line BLB12 is going to affect the potential in memory cell 20 also. Nevertheless, since the original data stored in memory cell 20 is a logic "0", both node point NB2 and complementary bit line BLB12 is at a high potential, memory cell 20 will be unaffected by the write operation.

In the second scenario, a data bit "1" is stored in memory cell 10 while a data bit "1" is stored in memory cell 20, and that a data bit "0" needs to be written into memory cell 10. That means logic "0" should be applied at the data input terminal DIN. This scenario is similar to the first one described above. Through various associated controlling signals and circuits, data input signal from DIN is transmitted to bit line BL1 and complementary bit line BLB12.

Therefore, bit line BL1 is at a low potential while complementary bit line BLB12 is at a high potential. In the meantime, the supply of control signal to the word line WL makes the pass transistors T13 and T14 of memory cell 10 conductive. Therefore, a new data bit is written into memory cell 10. However, due to the triggering of word line WL, pass transistors T23 and T24 of memory cell 20 will also be conductive.

Since the original data bit in memory cell 20 is logic "1", node point N2 is at a to high potential while node point NB2 is at a low potential. Because the Y control signals YS2 and YSB2 are not activated, the Y pass transistors T37 and T38 remains non-conductive. Hence, bit line BL2 is inactivated and so the potential at node point N2 is unaffected. However, node point NB2 is coupled by a conductive pass transistor to the complementary bit line BLB12, which is at a high potential.

With the complementary bit line BLB12 at a high potential and the node point NB2 at a low potential, a current will flow from the complementary bit line BLB12 via the pass transistor T24 to the node point NB2 and then going through the conductive pull down transistor T21 to the earth wire. The generation of such a current will tend to change the potential at node point NB2. If the potential at the node point NB2 rises to a level above the threshold voltage of the pull down transistor T22, pull down transistor T22 will start to conduct thereby changing the stored data bit in memory cell 20. However, node point NB2 is at the potential divider point between the pass transistor T24 and the pull down transistor T21. Hence, if we can adjust the impedance between the pass transistor T24 and the pull down transistor T21 after turning conductive, node point NB2 can be maintained at a potential below the threshold voltage of the pull down transistor T22. Therefore, the original data in memory cell 20 can be kept.

In the third scenario, a data bit "0" is stored in memory cell 10 while a data bit "1" is stored in memory cell 20, and that a data bit "1" needs to be written into memory cell 10. That means logic "1" should be applied at the data input terminal DIN. Through various associated controlling signals and circuits, data input signal from DIN is transmitted to bit line BL1 and complementary bit line BLB12 turning bit line BL1 to a high potential and complementary bit line BLB12 to a low potential. In the meantime, the supply of a control signal to the word line WL makes the pass transistors T13 and T14 of memory cell 10 conductive.

Therefore, a new data bit is written into memory cell 10. The original data bit stored in memory cell 20 is logic "1", therefore node N2 is at a high potential and node point NB2 is at a low potential. Although the activation of word line WL will make pass transistor T24 conductive thereby coupling node point NB2 and complementary bit line BLB12 together, they are both at a low potential. Therefore, data bit residing in memory cell 20 will be unaffected by the write operation.

The fourth scenario is a somewhat critical situation. In this case, a data bit "0" is stored in memory cell 10 while a data bit "0" is stored in memory cell 20, and that a data bit "1" needs to be written into memory cell 10. Similar to the previous scenario, logic "1" should be applied at the data input terminal DIN. Through various associated controlling signals and circuits, data input signal from DIN is transmitted to bit line BL1 and complementary bit line BLB12 turning bit line BL1 to a high potential and complementary bit line BLB12 to a low potential. In the meantime, the supply of control signal to the word line WL makes the pass transistors T13 and T14 of memory cell 10 conductive.

Therefore, a new data bit is written into memory cell 10. The original data bit stored in memory cell 20 is logic "0", therefore node N2 is at a low potential and node point NB2 is at a high potential. Since the Y pass transistor T37 and T38 are non-conductive, the high potential at the data line DL2 is unable to transmit across to node point N2. Therefore, the potential at node point N2 will be unaffected.

However, the pull up transistors T53 and the pass transistor T23 are conductive. Therefore, a current can flow from the power source VDD via the pull up transistor T53 and the pass transistor T23 to the node point N2, thereby affecting the potential at node point N2. If the potential at node point N2 is greater than the threshold voltage of the pull down transistor T21 so that the pull down transistor T21 becomes conductive, the original data residing in memory cell 20 can be changed.

Nevertheless, if we can somehow match the impedance between the pull up transistor T53, the pass transistor T23 and the pull down transistor T22 after being conductive so that the potential at node point N2 is below the threshold voltage of the pull down transistor T21, data change in memory cell 20 can be avoided.

On the other hand, since pass transistor T24 will be conductive due to activation by the word line WL, node point NB2 is coupled to the complementary bit line BLB12. Because complementary bit line BLB12 is at a low potential while node point NB2 is at a high potential, a current will tend to flow from node point NB2 via pass transistor T24 to the complementary bit line BLB12.

Figure 3:
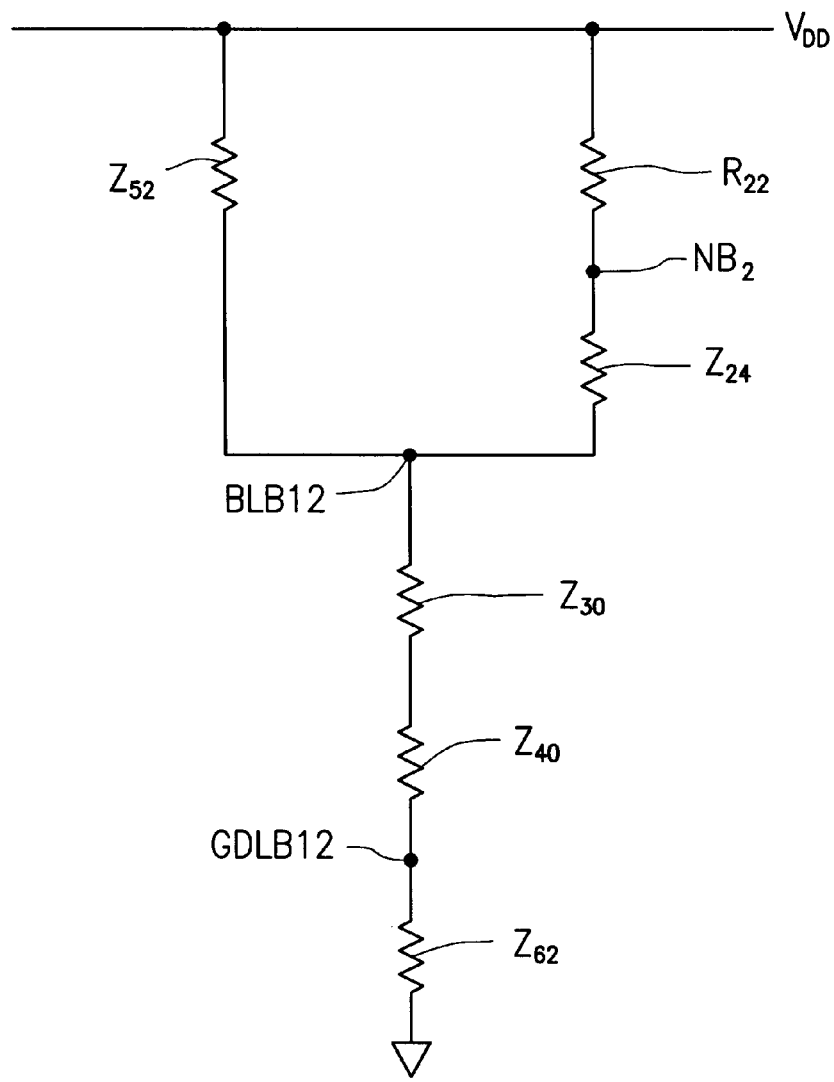
FIG. 3 is an equivalent circuit diagram showing the various impedances relative to node NB2 when data in memory cell 10 is changed according to the circuit shown in FIG. 2.

Therefore, potential at node point NB2 will be lowered. To understand the change in potential at node point NB2 better, FIG. 3 is an equivalent circuit diagram showing the various impedances relative to node NB2 when data in memory cell 10 is changed according to the circuit shown in FIG. 2. As shown in FIG. 3, R22 represents the load resistor at node point NB2, Z24 represents the impedance of pass transistor T24 when conductive, Z52 represents the impedance of pull up transistor T52 when conductive, Z30 represent in parallel impedance of Y pass transistors T33 and T34 when conductive, Z40 represents in parallel impedance of B pass transistors T43 and T44 when conductive, and Z62 represents impedance of driver transistor T62 between data input DIN and the common complementary bit line.

Roughly, the above resistance and impedance can be subdivided into three main categories, wherein the load resistor R22 has the largest resistance, impedance Z52 and Z62 have the lowest resistance, and the rest of the impedance are intermediate. In other words, R22>(Z24, Z30, Z40)>(Z52, Z62). Therefore, by carefully adjusting the impedance of pull up transistor T52, the Y pass transistors T33 and T34, the B pass transistors T43 and T44, the pull down transistor T62 and the pass transistor T24 when they are conductive so that the potential at the common complementary bit line BLB12 is not too low, and that the potential at node point NB2 is also not too low so as to cause the pull down transistor T22 stop being conductive, the original data in memory cell 20 can be maintained.

In the aforementioned description, the common bit line is the complementary bit line of the two memory cells. However, for those who are familiar with the technology, it can be seen that the memory structure is symmetrical. Therefore, by suitably changing the associated circuits, it is equally possible to form a structural design that has the bit lines of the two memory cells acting as the common bit line.

In summary, by adjusting the electrical parameters associated with the devices, a common complementary bit line can be used for accessing data in two memory cells without affecting each other. When two memory cells use just one common complementary bit line as in this invention, as much as one-fourth of the bit lines in a conventional SRAM can be eliminated. Therefore, the problem of cramming too many metal lines together in a conventional design is relieved. Thus, product yield and the number of memory cells that can be packed within a given wafer area can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A static random access memory structure that uses a common bit line, comprising:
   a first bit line;
   a second bit line;
   a common complementary bit line;
   a first memory cell with one end coupled to the first bit line and the other end coupled to the common complementary bit line;
   a second memory cell with one end coupled to the second bit line and the other end coupled to the common complementary bit line;
   a first Y-select signal controlling the first bit line; and
   a second Y-select signal controlling the second bit line; wherein the common complementary bit line is controlled jointly by the first Y-select signal and the second Y-select signal.

2. The structure of claim 1, wherein the first memory cell and the second memory cell are memory cells having a four NMOS transistor structure.

3. The structure of claim 1, wherein the structure further includes an OR gate and a third Y pass transistor, where the first Y-select signal and the second Y-select signal are fed to input terminals of the OR gate while the output from the OR gate is fed to the third Y pass transistor for controlling the common complementary bit line.

4. The structure of claim 1, wherein the first bit line is controlled by the first Y-select signal through the first Y pass transistor.

5. The structure of claim 1, wherein the second bit line is controlled by the second Y-select signal through the second Y pass transistor.

6. A static random access memory structure that uses a common bit line, comprising:

a first bit line;

a second bit line;

a common complementary bit line;

a first memory cell with one end coupled to the first bit line and the other end coupled to the common complementary bit line;

a second memory cell with one end coupled to the second bit line and the other end coupled to the common complementary bit line;

a first Y-select signal;

a first complementary Y-select signal, wherein the first Y-select signal and the first complementary Y-select signal together control the first bit line;

a second Y-select signal;

a second complementary Y-select signal, wherein the second Y-select signal and the second complementary Y-select signal together control the first bit line;

an OR gate with the first Y-select signal line coupled to a first input terminal of the OR gate, and the second Y-select signal line coupled to a second input terminal of the OR gate; and an AND gate with the first complementary Y-select signal line coupled to a first input terminal of the AND gate, and the second complementary Y-select signal line coupled to a second input terminal of the AND gate; wherein the output terminal of the AND gate and the output terminal of the OR gate together control the common complementary bit line.

7. The structure of claim 6, wherein the first memory cell and the second memory cell are memory cells having a four NMOS transistor structure.

8. A static random access memory structure that uses a common bit line, comprising:

a first complementary bit line;

a second complementary bit line;

a common bit line;

a first memory cell with one end coupled to the first complementary bit line and the other end coupled to the common bit line;

a second memory cell with one end coupled to the second complementary bit line and the other end coupled to the common bit line;

a first Y-select signal controlling the first complementary bit line; and a second Y-select signal controlling the second complementary bit line; wherein the common bit line is controlled jointly by the first Y-select signal and the second Y-select signal.

9. The structure of claim 8, wherein the first memory cell and the second memory cell are memory cells having a four NMOS transistor structure.

* * * * *